(12) United States Patent
Yan et al.

(10) Patent No.: US 11,632,535 B2
(45) Date of Patent: Apr. 18, 2023

(54) LIGHT FIELD IMAGING SYSTEM BY PROJECTING NEAR-INFRARED SPOT IN REMOTE SENSING BASED ON MULTIFOCAL MICROLENS ARRAY

(71) Applicant: Peking University, Beijing (CN)

(72) Inventors: Lei Yan, Beijing (CN); Shoujiang Zhao, Beijing (CN); Peng Yang, Beijing (CN); Yi Lin, Beijing (CN); Hongying Zhao, Beijing (CN); Kaiwen Jiang, Beijing (CN); Feizhou Zhang, Beijing (CN); Wenjie Fan, Beijing (CN); Haimeng Zhao, Beijing (CN); Jinfa Yang, Beijing (CN); Fan Liu, Beijing (CN)

(73) Assignee: Peking University, Beijing (CN)

( * ) Notice: Subject to any disclaimer, the term of this patent is extended or adjusted under 35 U.S.C. 154(b) by 102 days.

(21) Appl. No.: 17/139,419

(22) Filed: Dec. 31, 2020

(65) Prior Publication Data
US 2021/0203911 A1    Jul. 1, 2021

(30) Foreign Application Priority Data

Dec. 31, 2019 (CN) .......................... 201911408330.3
Apr. 23, 2020 (CN) .......................... 202010326556.5

(51) Int. Cl.
*H04N 13/254* (2018.01)
*H04N 13/232* (2018.01)
(Continued)

(52) U.S. Cl.
CPC .......... *H04N 13/254* (2018.05); *G01B 11/25* (2013.01); *G06T 7/521* (2017.01); *G06T 7/529* (2017.01); *G06T 7/557* (2017.01); *G06T 15/55* (2013.01); *H01L 27/14627* (2013.01); *H04N 5/332* (2013.01); *H04N 13/232* (2018.05)

(58) Field of Classification Search
CPC .......... G06T 7/50; G06T 7/521; G06T 7/529; G06T 7/557; G01B 11/254; G01B 11/25
See application file for complete search history.

(56) References Cited

U.S. PATENT DOCUMENTS 5,743,614 A * 4/1998 Salerno ............. G02F 1/133308
                                              348/E5.145
8,400,555 B1 * 3/2013 Georgiev ........... H04N 5/22541
                                              348/222.1

(Continued)

*Primary Examiner* — King Y Poon
*Assistant Examiner* — Vincent Peren
(74) *Attorney, Agent, or Firm* — Troutman Pepper Hamilton Sanders LLP; Christopher C. Close, Jr.

(57) ABSTRACT

The present disclosure provides a light field imaging system by projecting near-infrared spot in remote sensing based on a multifocal microlens array. The light field imaging system includes a near-infrared spot projection apparatus (100) and a light field imaging component (200), where the near-infrared spot projection apparatus (100) is configured to scatter near-infrared spots on a to-be-observed object to add texture information to a target image, and the light field imaging component (200) is configured to image a target scene light ray with additional texture information. The present disclosure can extend a target depth-of-field (DOF) detection range, and particularly, reconstruct a surface of a weak-texture object.

5 Claims, 4 Drawing Sheets

(51) Int. Cl.
  *H01L 27/146* (2006.01)
  *H04N 5/33* (2006.01)
  *G06T 15/55* (2011.01)
  *G06T 7/521* (2017.01)
  *G06T 7/557* (2017.01)
  *G01B 11/25* (2006.01)
  *G06T 7/529* (2017.01)

(56) References Cited

U.S. PATENT DOCUMENTS

| | | | |
|---|---|---|---|
| 2009/0077504 A1* | 3/2009 | Bell | G06F 3/017 |
| | | | 715/863 |
| 2009/0096783 A1* | 4/2009 | Shpunt | G06V 20/00 |
| | | | 348/E13.001 |
| 2010/0177164 A1* | 7/2010 | Zalevsky | H04N 13/20 |
| | | | 348/46 |
| 2011/0080487 A1* | 4/2011 | Venkataraman | G02B 3/0062 |
| | | | 348/E5.024 |
| 2012/0050562 A1* | 3/2012 | Perwass | G02B 3/0056 |
| | | | 348/222.1 |
| 2015/0138346 A1* | 5/2015 | Venkataraman | G01B 11/22 |
| | | | 348/135 |
| 2015/0156478 A1* | 6/2015 | Ono | H04N 13/282 |
| | | | 348/49 |
| 2015/0294472 A1* | 10/2015 | Putraya | G06T 7/557 |
| | | | 382/154 |
| 2017/0059305 A1* | 3/2017 | Nonn | G01B 11/2513 |
| 2017/0243373 A1* | 8/2017 | Bevensee | G06T 7/557 |
| 2019/0197714 A1* | 6/2019 | Pau | H01L 27/14623 |
| 2019/0231220 A1* | 8/2019 | Refai | A61B 1/051 |

* cited by examiner

LIGHT FIELD IMAGING SYSTEM BY PROJECTING NEAR-INFRARED SPOT IN REMOTE SENSING BASED ON MULTIFOCAL MICROLENS ARRAY

TECHNICAL FIELD

The present disclosure relates to a light field imaging system by projecting near-infrared spot in remote sensing based on a multifocal microlens array, to extend a target depth-of-field (DOF) detection range, and particularly, to reconstruct a surface of a remote sensing weak-texture object. The present disclosure mainly provides a light field camera structure by projecting near-infrared spot in remote sensing based on a multifocal microlens array, to effectively extend an observation DOF range of a camera. A near-infrared spot projection apparatus is used to project an eye-safe near-infrared band texture pattern onto a surface of a detected object, to add texture information when there is no texture information on the surface of the detected object. This can improve three-dimensional (3D) reconstruction precision of a detected weak-texture object.

BACKGROUND

In the field of remote sensing and photogrammetry, a traditional 3D object reconstruction method is to shoot an object from multiple angles based on a single imaging device, and reconstruct a surface of the object on images obtained at the multiple angles. Multi-view shooting means a larger amount of data obtained by a camera, more 3D reconstruction time, and lower 3D reconstruction efficiency. Currently, a single image captured by a traditional camera cannot provide complete or real 3D information, failing to satisfy current engineering-based application requirements. Different from the traditional camera, a light field camera can sample, within a same exposure period, multiple light rays emitted or reflected by a same object point to space, and construct a 3D model of a scene based on information of these light rays. A microlens array constituted by tens of thousands of small lenses is disposed between a main lens and a photosensitive sensor of the light field camera. The multifocal microlens array can receive a light ray from the main lens and generates an image on the photosensitive sensor, thereby implementing 3D reconstruction more quickly.

In the field of remote sensing and photogrammetry, a multi-view geometric method is usually used for 3D reconstruction. In the method, the camera is regarded as a pinhole imaging model to obtain light ray information of a same object point and calculate a geometric position structure, to restore a 3D scene of the physical world. That is, an object is shot by using a multi-view camera, and original 3D information is constructed based on multiple images including two-dimensional information. However, a premise of successful 3D reconstruction is valid matching of the two-dimensional information. In addition, a relative position and attitude of the camera need to be calibrated in advance. Moreover, when a monocular camera is used to perform observation for multiple times to simulate a multi-lens camera, 3D reconstruction cannot be effectively performed for a moving object. The light field camera including the multifocal microlens array can effectively resolve the foregoing problems. As an optical camera with a special structure, the light field camera uses microlens to repeatedly sample light rays, so that the light field camera can sample, within a same exposure period, multiple light rays emitted or reflected by a same object point to the space. Information of these light rays is light field information of the object, and 3D information of an image captured by a single camera is reconstructed based on the light field information.

A hardware prototype of the array-type light field camera was proposed by the MIT Vision Lab in 2002. An 8*8 camera array is constructed by using 64 cameras. However, the array-type light field camera is not portable because of its huge volume. In 2011, a prototype of the first portable microlens light field camera LYTRO in the world was developed by Ren Ng, Marc Levoy, and so on based on an imaging principle of the multifocal microlens array.

At present, a traditional light field imaging method is still very limited for a DOF range of object observation. In addition, in a 3D depth reconstruction process, lack of texture information is always an important factor of a poor 3D reconstruction effect. However, in the present disclosure, a near-infrared spot projection apparatus is used to add texture information for a weak-texture object under a natural condition. This can better reconstruct surface-type 3D information of the weak-texture object, and retain a real color of the object. In addition, a multifocal microlens array is used to effectively extend an observation DOF range of the light field camera. Therefore, the present disclosure can be widely applied to the field of remote sensing 3D imaging. The multifocal microlens array is used to sample light field information of the weak-texture object to reconstruct 3D information of a single image captured by the single camera. When texture information of an observed object is insufficient, 3D information and color information of the observed object can be extracted more accurately.

An underlying objective of future remote sensing stereoimaging is single camera-based 3D imaging. The light field imaging method can implement the objective of stereoimaging. However, to implement the objective of stereoimaging, a physical apparatus of stereoimaging needs to be implemented first. Precise light field imaging is used to implement accurate 3D reconstruction of an object with weak or no textures in the field of remote sensing and photogrammetry, and resolve a problem that a routine remote sensing and photogrammetry method cannot effectively reconstruct an object with a few textures. Now, a platform in the field of remote sensing and photogrammetry is no longer limited to satellites and high-altitude manned aircrafts. With the development of small unmanned aerial vehicles, using the small unmanned aerial vehicle to shoot a measured object within a distance of a few meters has obvious advantages in 3D reconstruction of vertical planes such as canyons and buildings. The light field imaging system in the present disclosure is light and small, and therefore, is well suited to the small unmanned aerial vehicle to perform 3D reconstruction and depth measurement on the object.

SUMMARY

To implement high-precision depth observation by a light field camera within a large object space range, and improve a 3D reconstruction effect of a weak-texture object, the present disclosure provides a light field imaging system by projecting near-infrared spot in remote sensing based on a multifocal microlens array, to extend a target DOF detection range, and particularly, to reconstruct a surface of the weak-texture object. The present disclosure provides a light field camera structure based on a multifocal microlens array, to effectively extend an observation DOF range of a camera. In addition, A near-infrared spot projection apparatus is used to project an eye-safe near-infrared band texture pattern onto a surface of a detected object, to add texture information when there is no texture information on the surface of the detected object. This can improve 3D reconstruction precision of the detected object.

To achieve the above objectives, the present disclosure adopts the following technical solutions:

The present disclosure provides a light field imaging system by projecting near-infrared spot in remote sensing based on a multifocal microlens array. The light field imaging system mainly includes:

a near-infrared spot projection apparatus, including a near-infrared light-emitting diode (LED) light source, a spherical reflector, a condensing lens, a projection pattern sheet, and a projection objective lens, and configured to scatter near-infrared spots on a to-be-observed object and actively add texture information to a target image, where a light spot pattern is determined by a pattern on the projection pattern sheet; and a light field imaging component, including an image detector that responds to both visible light and near-infrared bands, a microlens array constituted by multifocal microlens units, and an imaging objective lens. A main lens can effectively compress an imaging depth of field of the object to image space. The image space can be observed by a miniature camera array constituted by the multifocal microlens array and the image detector. In addition, a target scene light ray of a projection pattern is added, and forms an image on the image detector after passing through the imaging objective lens and the multifocal microlens array. The image received by the image detector is obtained by overlaying an original target image and a near-infrared spot pattern.

The near-infrared LED light source of the near-infrared spot projection apparatus is a high-brightness near-infrared-band LED. The spherical reflector is disposed on a non-output side of the LED light source, and the LED light source is disposed at a center of the spherical reflector to avoid wasting optical energy on the non-output side. A condensing system of the near-infrared spot projection apparatus includes the spherical reflector and the condensing lens. The spherical reflector reflects a backward light ray to enhance light brightness in a light emitting direction. The condensing lens converges light from the near-infrared LED light source into an image and projects the image onto the projection pattern sheet, to illuminate the projection pattern sheet.

The projection objective lens of the near-infrared spot projection apparatus images the illuminated projection pattern sheet on the to-be-observed object and scatters a light spot pattern on the projection pattern sheet.

In the present disclosure, a microlens structure is used for camera building, thereby effectively reducing costs. In addition, as microlens processing technologies are improved, lens diameter processing accuracy can reach 1 micron, and a design error of a radius of curvature can be controlled to be within 5%, thereby satisfying production requirements of a light field camera. The multifocal microlens array is disposed on an incident side of the image detector. The imaging objective lens is disposed on an incident side of the multifocal microlens array, and is configured to converge light from the to-be-observed object and project the light onto the multifocal microlens array.

The multifocal microlens array includes microlens units of three focal lengths that are arranged in different arrays. Each microlens unit corresponds to multiple photosensitive units on an image sensor, and a distance between the multifocal microlens array and a charge coupled device (CCD) detector or a complementary metal-oxide semiconductor (CMOS) detector is equal to a focal length of a medium-focal-length microlens unit, so that a detector unit covered by a microlens can collect a light ray refracted by the main lens. This avoids a waste of detector units, and prevents a pixel from being unavailable due to aliasing when detector units covered by two adjacent microlens perform imaging.

The multifocal microlens array may be an array constituted by orthogonally-arranged bifocal microlens units, an array constituted by orthohexagonally-arranged bifocal microlens units, or an array constituted by orthohexagonally-arranged trifocal microlens units. For a multifocal microlens system, a DOF range can be effectively extended by setting a proper focal length for the microlens. Therefore, when a depth of an object point is calculated through all-in-focus processing, an all-in-focus image clearer than an image obtained by using a monofocal system can be restored.

By means of the foregoing technical solution, the present disclosure has the following advantages:

1. A 3D reconstruction principle of a light field camera is to record direction and color information of light rays in space. Particularly, a microlens camera array is used to sample light rays emitted or reflected by a same object point, to form light field distribution, so that 3D imaging can be performed. A microlens light field camera can be regarded as a secondary imaging system. The camera completes object image conversion by using a front main lens, and a miniature camera system constituted by microlens and a detector is used to perform secondary light field sampling on image space. In the present disclosure, the microlens light field camera is used for analysis, and a multifocal microlens camera system for 3D imaging is constructed. The multifocal microlens camera system mainly includes a detector array, a multifocal microlens array, and an imaging objective lens. For the multifocal microlens system, a DOF range can be effectively extended by setting a proper focal length for the microlens. Therefore, when calculation is performed through all-in-focus processing, an all-in-focus image clearer than an image obtained by using a monofocal system can be restored.

2. In the present disclosure, a light spot projection apparatus is used to project a texture pattern onto a surface of an object, to actively enrich texture information of the surface of the object. This can improve matching precision of 3D reconstruction, and improve depth measurement precision of the light field camera. To ensure safety of human eyes, an about 800 nm near-infrared band is used as a light source. On this band, a common visible light CCD detector can also make a response well, and no dedicated infrared detector needs to be used, thereby effectively reducing costs.

3. By combining microlens, photogrammetry, and computer vision technologies, the present disclosure provides a light field camera system for active projection based on a multifocal microlens array. The present disclosure is pioneering and practical, and can be widely used for 3D reconstruction of a weak-texture object.

In the foregoing figures, 10 represents a light field camera by projecting near-infrared spot in remote sensing based on a multifocal microlens array; 100 represents a near-infrared spot projection apparatus; 110 represents a spherical reflector; 120 represents a near-infrared LED light source; 130 represents a condensing lens; 140 represents a projection pattern sheet; 150 represents a projection objective lens; 200 represents a light field imaging system; 210 represents an image detector; 220 represents a multifocal microlens array; and 230 represents an imaging objective lens.

DETAILED DESCRIPTION

The present disclosure is described in detail below with reference to the accompanying drawings and embodiments.

To make the to-be-resolved technical problems, the technical solutions, and the beneficial effects of the embodiments in the present disclosure clearer, the present disclosure is described in further detail below with reference to the accompanying drawings and embodiments. It should be understood that the specific embodiments described herein are merely intended to explain the present disclosure, rather than to limit the present disclosure.

Figure 1:
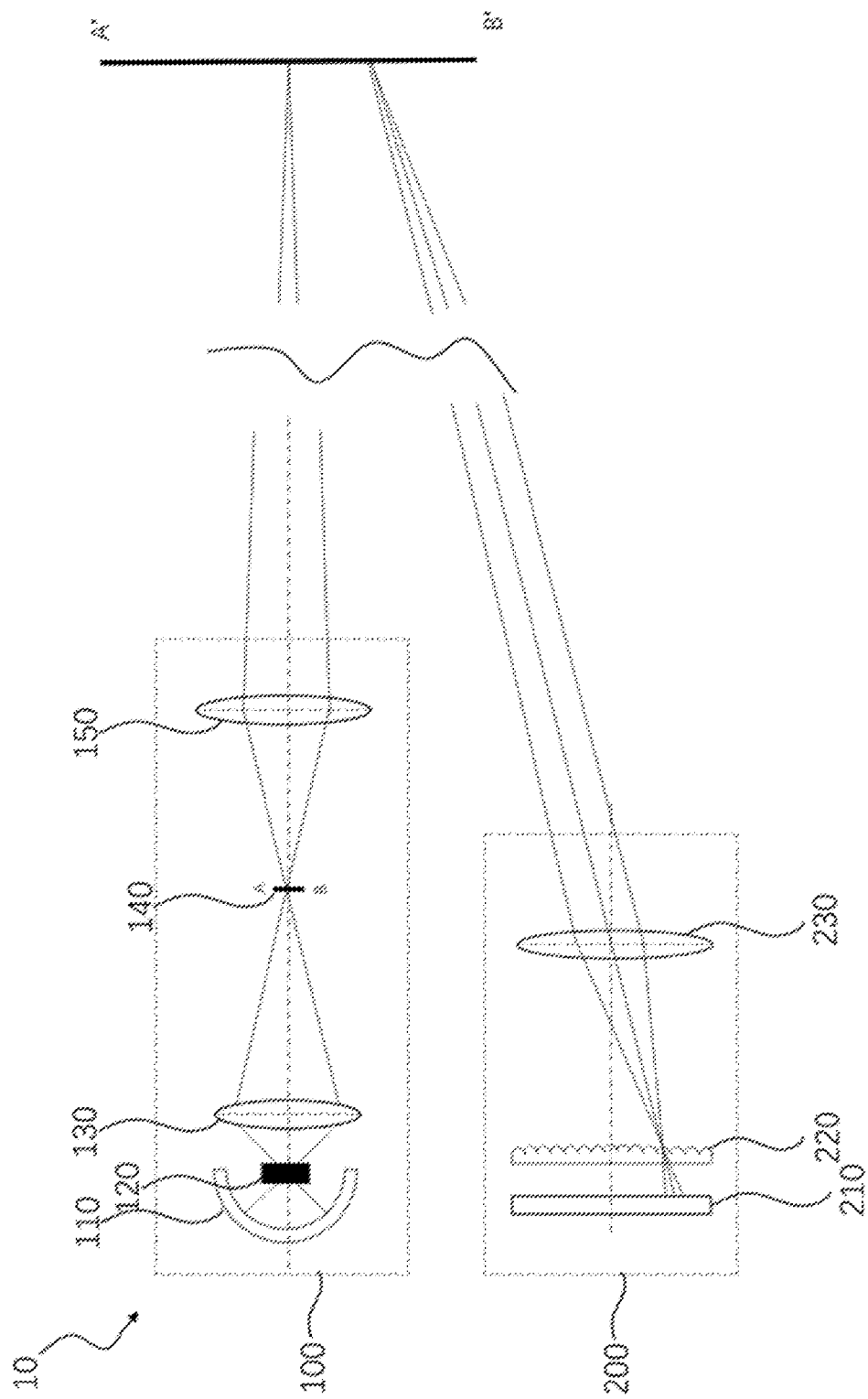
FIG. 1 is a schematic structural diagram of a near-infrared light field camera based on a multifocal microlens array according to an embodiment of the present disclosure.

An embodiment of the present disclosure provides a light field camera by projecting near-infrared spot in remote sensing based on a multifocal microlens array. Refer to FIG. 1. The light field camera is described below.

A near-infrared spot projection apparatus 100 includes a spherical reflector 110, a near-infrared LED light source 120, a condensing lens 130, a projection pattern sheet 140, and a projection objective lens 150 that are disposed along an optical path. The near-infrared spot projection apparatus 100 and a light field imaging component 200 may be integrated together or may be deployed separately. The near-infrared spot projection apparatus 100 is mainly configured to project a pattern on the projection pattern sheet onto a to-be-observed object to add target texture information.

Further, the near-infrared LED light source 120 needs to be disposed at a center of the spherical reflector 110 to avoid wasting optical energy on a non-output side. Therefore, light from the near-infrared LED light source 120 forms an image at an original position of the near-infrared LED light source 120 after being reflected by the spherical reflector.

Further, the near-infrared LED light source 120 and the projection pattern sheet 140 are located on one pair of conjugate image planes of the condensing lens 130, so that an image formed from the near-infrared LED light source 120 through the condensing lens coincides with the projection pattern sheet. The near-infrared LED light source 120 may be an LED light source or an array constituted by LEDs. The condensing lens 130 may be a single lens or a lens group. The projection pattern sheet 140 is a transparent pattern formed by engraving a hollow pattern on a transparent material or by coating opaque paint on a transparent material.

Further, the projection objective lens 150 projects, onto the to-be-observed object, an image formed from the illuminated projection pattern sheet 140. The projection objective lens 150 may be a single lens or a lens group.

Refer to FIG. 1. The light field imaging component 200 is constituted by an image detector 210, a multifocal microlens array 220, and an imaging objective lens 230.

The image detector 210 is a CCD detector or a CMOS detector that responds to both visible light and near-infrared light.

Figure 2:
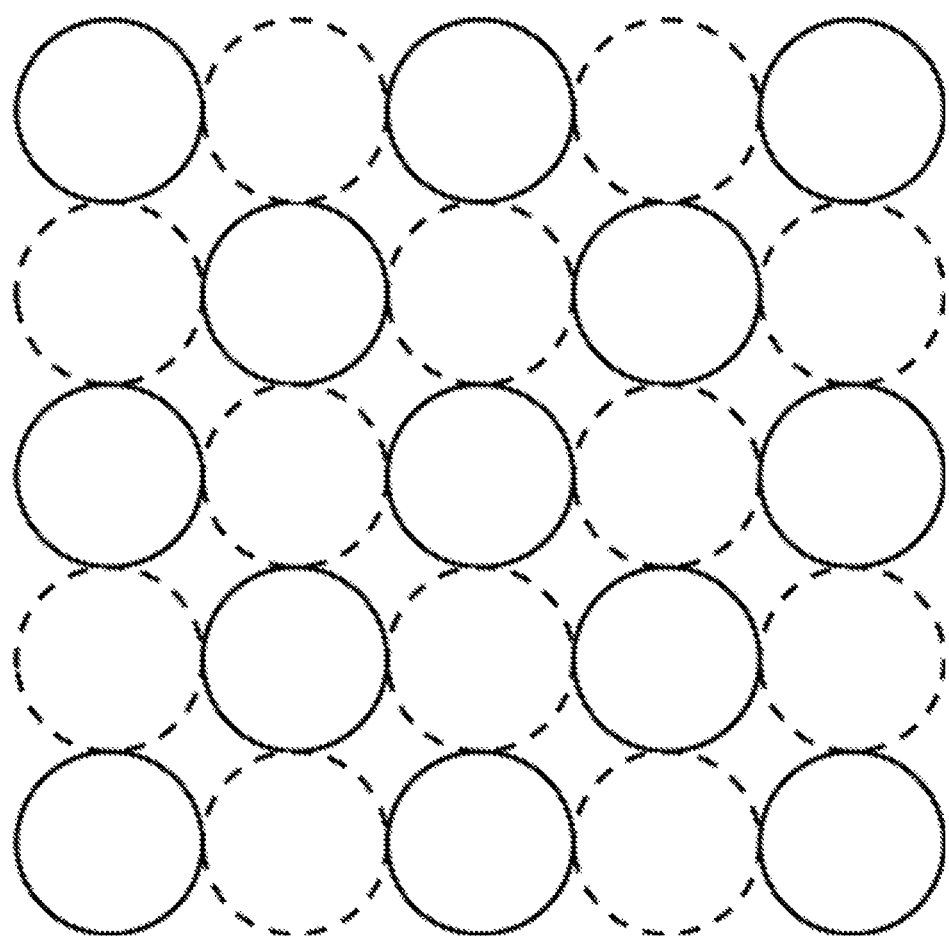
FIG. 2 is a schematic structural diagram of a microlens array constituted by orthogonally-arranged bifocal microlens units according to an embodiment of the present disclosure.
Figure 3:
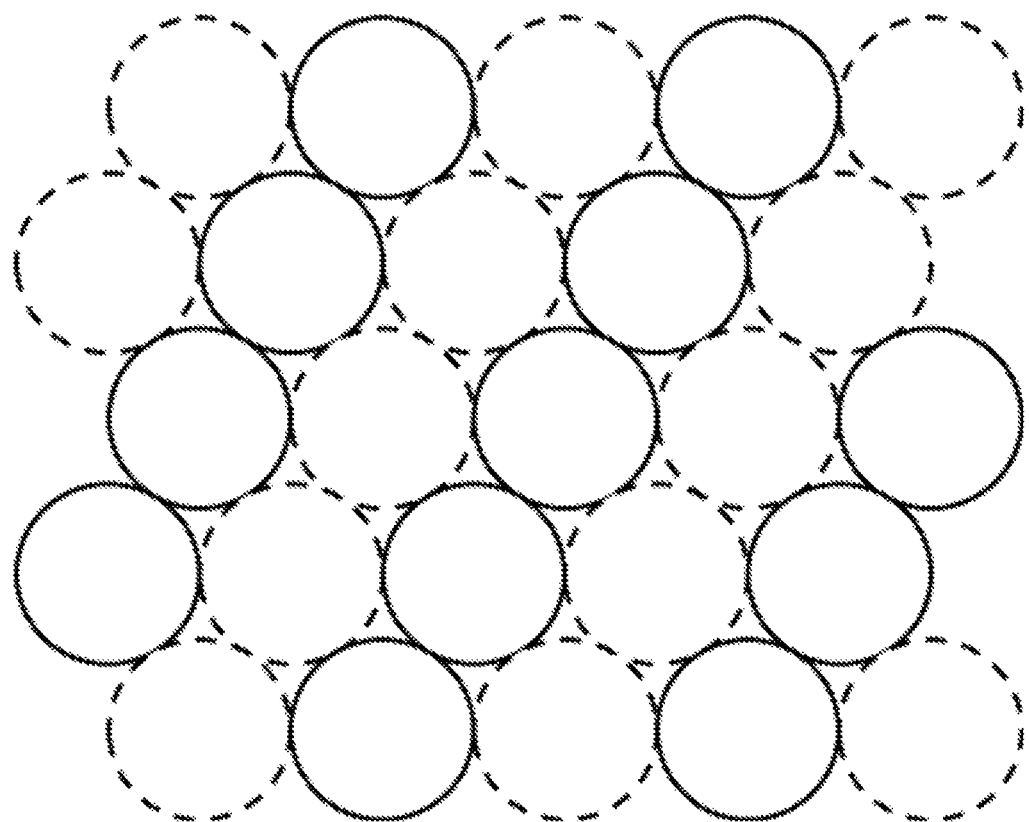
FIG. 3 is a schematic structural diagram of a microlens array constituted by orthohexagonally-arranged bifocal microlens units according to an embodiment of the present disclosure.
Figure 4:
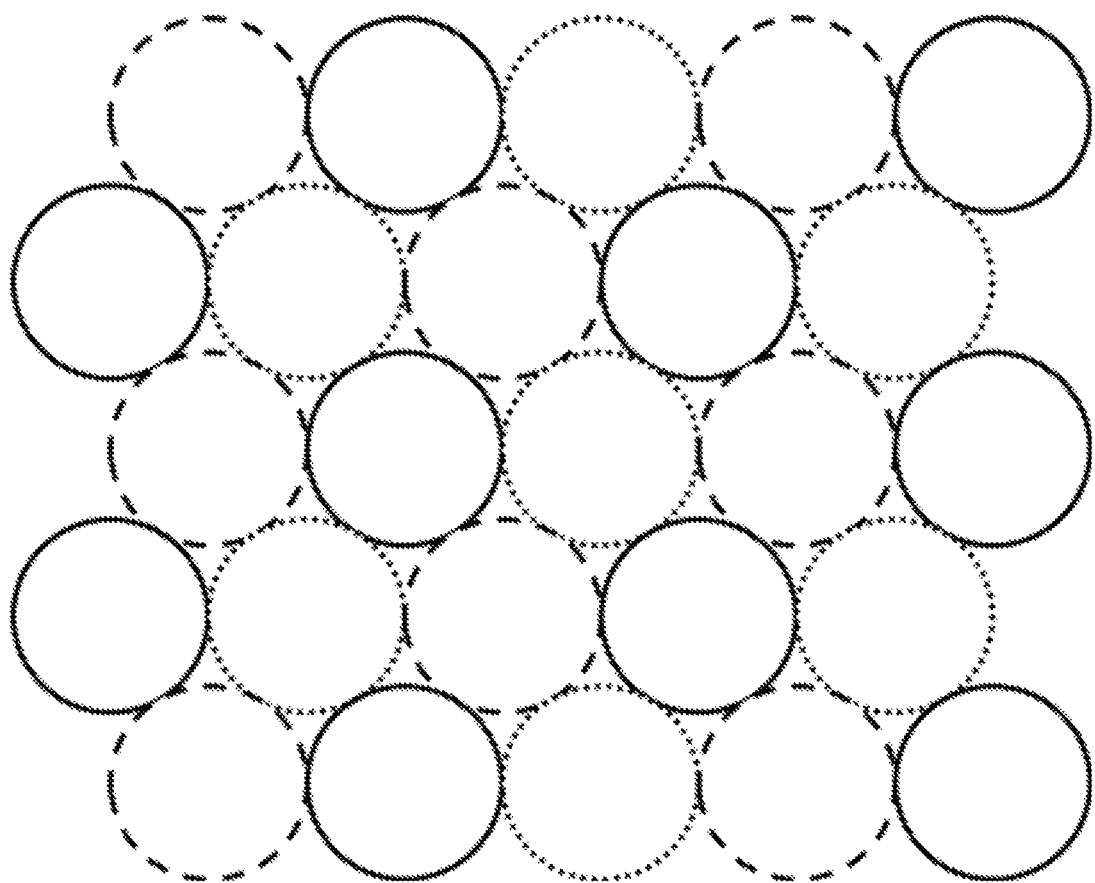
FIG. 4 is a schematic structural diagram of a microlens array constituted by orthohexagonally-arranged trifocal microlens units according to an embodiment of the present disclosure.

The multifocal microlens array 220 may be an array constituted by orthogonally-arranged bifocal microlens units in FIG. 2, an array constituted by orthohexagonally-arranged bifocal microlens units in FIG. 3, or an array constituted by orthohexagonally-arranged trifocal microlens units in FIG. 4. The microlens units of the multifocal microlens array 220 are of a doubly-salient structure or a plano-convex structure.

The imaging objective lens 230 may be a prime lens group or a zoom lens group, and is configured to collect a light ray of a target environment and project the light ray onto the multifocal microlens array.

It should be noted that, when a component is "fastened" or "disposed" on another component, the component may be directly fastened or disposed on the another component or there may be an intermediate component. When a component is "connected" to another component, the component may be directly connected to the another component or there may be an intermediate component.

It should be understood that in the description of the present disclosure, terms such as "length", "width" "upper", "lower", "front", "rear", "left", "right", "vertical", "horizontal", "top", "bottom", "inside" and "outside" indicate the orientation or position relationships based on the drawings. They are merely intended to facilitate or simplify description of the embodiments of the present disclosure, rather than to indicate or imply that the mentioned apparatus or component must have a specific orientation and must be constructed and operated in a specific orientation. Therefore, these terms should not be construed as a limitation to the present disclosure.

The above descriptions are merely preferred embodiments of the present disclosure, and are not intended to limit the present disclosure. Any modification, equivalent substitution and improvement without departing from the spirit and principle of the present disclosure shall be included within the protection scope of the present disclosure.

What is claimed is:

1. A light field imaging system by projecting near-infrared spot in remote sensing based on a multifocal micro-lens array, comprising a near-infrared spot projection apparatus and a light field imaging component, wherein the near-infrared spot projection apparatus is configured to scatter near-infrared spots on a to-be-observed object to add texture information to a target image, and the light field imaging component is configured to image a target scene light ray with texture information;

wherein the near-infrared spot projection apparatus comprises a spherical reflector, a near-infrared light-emitting diode (LED) light source, a condensing lens, a projection pattern sheet, and a projection objective lens in sequence, and is configured to project a pattern on a projection pattern sheet onto the to-be-observed object to add target texture information; and wherein the near-infrared LED light source is disposed at a center of the spherical reflector, and the near-infrared LED light source and the projection pattern sheet are located on one pair of conjugate image planes of the condensing lens, so that an image formed from the near-infrared LED light source through the spherical reflector coincides with the projection pattern sheet; and the projection objective lens is configured to project, onto the to-be-observed object, an image formed from the illuminated projection pattern sheet.

2. The light field imaging system according to claim 1, wherein the projection pattern sheet is a transparent pattern formed by engraving a hollow pattern on a transparent material or by coating opaque paint on a transparent material.

3. The light field imaging system according to claim 1, wherein the light field imaging component comprises an image detector, a multifocal micro-lens array, and an imaging objective lens in sequence; the imaging objective lens is configured to adjust an imaging depth of field (DOF) of the to-be-observed object such that the to-be-observed object is imaged into image space; and the image space is observed and received by a miniature camera array constituted by the image detector and the multifocal micro-lens array, so that the target scene light ray with the texture information passes through the imaging objective lens and the multifocal micro-lens array in sequence and forms an image on the image detector.

4. The light field imaging system according to claim 3, wherein the image detector is a charge coupled device (CCD) detector or a complementary metal-oxide semiconductor (CMOS) detector that responds to both visible light and near-infrared light; micro-lens units of the multifocal micro-lens array are of a bi-convex structure or a plano-convex structure, and the micro-lens units are orthogonally-arranged bifocal micro-lens units, orthohexagonally-arranged bifocal micro-lens units, or orthohexagonally-arranged trifocal micro-lens units; and the imaging objective lens is a prime lens group or a zoom lens group, and is configured to collect a light ray of a target environment and perform imaging.

5. The light field imaging system according to claim 1, wherein the near-infrared spot projection apparatus and the light field imaging component is integrated together or is deployed separately.

* * * * *